US010838020B2

(12) United States Patent
Lynde et al.

(10) Patent No.: US 10,838,020 B2
(45) Date of Patent: Nov. 17, 2020

(54) MAGNETIC SENSOR ARRAY AND SYSTEM

(71) Applicant: INNOVAURA CORPORATION, Edmonds, WA (US)

(72) Inventors: C. Macgill Lynde, Bellevue, WA (US); David B. Goodson, Bellevue, WA (US); Christopher A. Wiklof, Everett, WA (US)

(73) Assignee: INNOVAURA CORPORATION, Edmonds, WA (US)

( * ) Notice: Subject to any disclaimer, the term of this patent is extended or adjusted under 35 U.S.C. 154(b) by 320 days.

(21) Appl. No.: 15/227,122

(22) Filed: Aug. 3, 2016

(65) Prior Publication Data

US 2017/0030981 A1 Feb. 2, 2017

Related U.S. Application Data

(63) Continuation of application No. PCT/US2015/014325, filed on Feb. 3, 2015.

(60) Provisional application No. 61/935,178, filed on Feb. 3, 2014.

(51) Int. Cl.
| | | |
|---|---|---|
| G01R 33/00 | (2006.01) | |
| H01L 43/08 | (2006.01) | |
| H01L 25/04 | (2014.01) | |
| H01L 43/02 | (2006.01) | |
| H01L 43/12 | (2006.01) | |

(52) U.S. Cl.
CPC .......... *G01R 33/0094* (2013.01); *H01L 25/04* (2013.01); *H01L 43/02* (2013.01); *H01L 43/08* (2013.01); *H01L 43/12* (2013.01); *H01L 2224/48227* (2013.01)

(58) Field of Classification Search
CPC ............................. G01R 33/00; G01R 33/0094
USPC ........................................................ 324/252
See application file for complete search history.

(56) References Cited

U.S. PATENT DOCUMENTS 6,736,978 B1 5/2004 Porter et al.
2013/0265039 A1 10/2013 Cai et al.

FOREIGN PATENT DOCUMENTS

| JP | 09-243725 | 9/1997 | |
|---|---|---|---|
| JP | 2006-349496 | 12/2006 | |
| JP | 2010-014701 | 1/2010 | |
| WO | WO-2015074005 A1 * | 5/2015 | ........... C12Q 1/6869 |

OTHER PUBLICATIONS

PCT International Search Report and Written Opinion of PCT Application No. PCT/US2015/014325 dated May 11, 2015.

* cited by examiner

*Primary Examiner* — Reena Aurora
(74) *Attorney, Agent, or Firm* — Christopher A. Wiklof; Launchpad IP, Inc.

(57) ABSTRACT

A magnetic sensor array includes non-packaged magnetic sensors disposed on a substrate. The non-packaged magnetic sensors can include bare dice, in one embodiment. In another embodiment, the magnetic sensors are formed directly on the substrate, such as by printing conductive traces on the substrate. In another embodiment, a magnetic sensor array includes a magnetic field converter configured to launch received magnetic fields along an axis corresponding to a magnetic sensor maximum sensitivity.

30 Claims, 12 Drawing Sheets

MAGNETIC SENSOR ARRAY AND SYSTEM

CROSS REFERENCE TO RELATED APPLICATIONS

The present application is a U.S. Continuation Application which claims priority benefit under 35 U.S.C. § 120 (pre-AIA) of co-pending International Patent Application No. PCT/US2015/014325, entitled "MAGNETIC SENSOR ARRAY AND SYSTEM," filed Feb. 3, 2015; which application claims priority benefit from U.S. Provisional Patent Application No. 61/935,178, entitled "MAGNETIC SENSOR ARRAY AND SYSTEM," filed Feb. 3, 2014; each of which, to the extent not inconsistent with the disclosure herein, is incorporated by reference.

BACKGROUND

Magnetic sensors are typically available as discrete packaged devices configured for through-hole or surface mounting to a printed wiring board. The conventional approach limits the areal density in which sensor arrays can be configured and/or adversely affects cost. Moreover, there has not heretofore been an appreciation that areal density of magnetometers is important.

In another aspect, supporting magnetometers for three-axis magnetic field sensing has heretofore required the use of bulky packaged magnetometers.

SUMMARY

According to an embodiment, a magnetic sensor or magnetometer array includes a substrate, a sensor array interface disposed on the substrate, a plurality of sensors disposed on the substrate, and a sensor interface circuit disposed on the substrate and configured to operatively couple the plurality of magnetic sensors to the sensor array interface.

According to an embodiment, a magnetic sensor array includes a plurality of magnetic field sensors disposed on a substrate and configured to detect magnetic field components parallel to the substrate. According to an embodiment, a magnetic field converter guides a magnetic field component along its surface to cause a magnetic field component normal to the substrate to be detected by a magnetic field sensor configured to detect magnetic field components parallel to the substrate.

According to an embodiment, a magnetic sensor array includes a plurality of magnetic field sensors disposed on a substrate and configured to detect magnetic field components normal to the substrate. According to an embodiment, a magnetic field converter guides a magnetic field component along its surface to cause a magnetic field component parallel to the substrate to be detected by a magnetic field sensor configured to detect magnetic field components normal to the substrate.

According to an embodiment, a magnetic sensor array includes a plurality of unpackaged magnetic field sensor devices disposed on a substrate. In an embodiment, the plurality of unpackaged magnetic field sensor devices include respective subsets configured to sense a magnetic field component along an x-axis parallel to the substrate, a magnetic field component along a y-axis parallel to the substrate, and a magnetic field component along a z-axis normal to the substrate.

According to an embodiment, a magnetic sensor array includes a plurality of unpackaged magnetic field sensor devices disposed on a substrate, the magnetic sensor array including a subset configured to detect a magnetic field component along an x-axis parallel to the substrate and another subset configured to detect a magnetic field component along a y-axis perpendicular to the x-axis and parallel to the substrate. According to an embodiment, the magnetic sensor array is operatively coupled to a magnetic field converter configured to cause a portion of the x-axis magnetic field sensors to detect magnetic field components from both the x-axis and from the z-axis normal to the substrate. According to an embodiment, the magnetic sensor array is operatively coupled to a magnetic field converter configured to cause a portion of the y-axis magnetic field sensors to detect magnetic field components from both the y-axis and from the z-axis.

According to an embodiment, a magnetic field sensor system includes a signal processor operatively coupled to each of the magnetic field sensors. The signal processor is configured to extract from sensor output sensed magnetic field components corresponding to z-axis from sensed magnetic field components corresponding to the x- and y-axes.

According to an embodiment, a magnetic sensor array includes a plurality of magnetic sensors formed on a substrate. In one embodiment, the magnetic sensors are formed from a conductive thick film paste deposited and cured on the substrate. For example, the conductive thick film paste can be screen printed or pad printed.

In an embodiment, a magnetic sensor array can be formed on a flexible substrate. In an embodiment, a magnetic sensor array can be formed on a curved substrate.

According to an embodiment, a method for operating a magnetic sensor array includes, for each of a plurality of magnetometers in a magnetic sensor array, receiving a magnetic field having a magnetic field component along a first axis, guiding the magnetic field component with a magnetic field converter from the first axis to a second axis, receiving the magnetic field along the second axis with the magnetometer, and outputting a signal or data proportional to the received magnetic field strength along the second axis from the magnetometer through a sensor interface circuit to a sensor array interface. The method can further include receiving a plurality of data or signals corresponding to the plurality of magnetometers from the sensor array interface into a magnetic pattern analysis circuit and generating an image of a magnetic field pattern corresponding to the received magnetic field at each of a plurality of magnetometer locations in the magnetic sensor array.

According to an embodiment, a method for making a magnetic sensor array includes providing a substrate including a sensor interface circuit, affixing a plurality of magnetometers at respective predetermined locations to the substrate, electrically coupling each of the magnetometers to the sensor interface circuit, and coupling a sensor array interface to the sensor interface circuit. The plurality of magnetometers can be unpackaged magnetometers.

DETAILED DESCRIPTION

Figure 1:
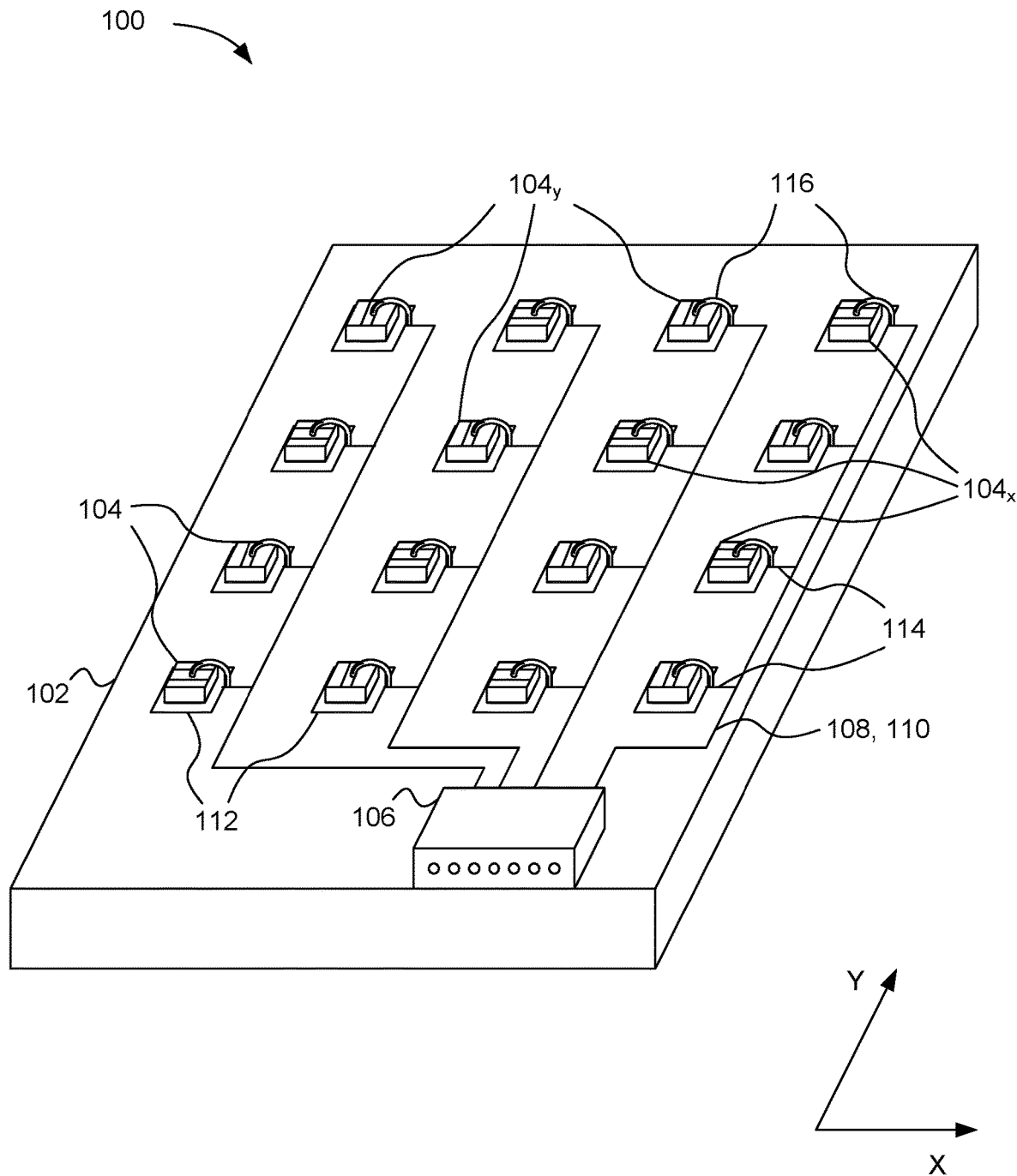
FIG. 1 is view of a magnetic sensor array, according to an embodiment.

In the following detailed description, reference is made to the accompanying drawings, which form a part hereof. In the drawings, similar symbols typically identify similar components, unless context dictates otherwise. Other embodiments may be used and/or other changes may be made without departing from the spirit or scope of the disclosure.

FIG. 1 is view of a magnetic sensor array 100, according to an embodiment. The magnetic sensor array 100 includes a substrate 102. A plurality of magnetic sensors 104 and a sensor array interface 106 are disposed on the substrate 102. A sensor interface circuit 108 is disposed on the substrate 102 and configured to operatively couple the plurality of magnetic sensors 104 to the sensor array interface 106.

According to an embodiment, a first portion 104x of the plurality of magnetic sensors 104 can be arranged to detect local magnetic fields along an x-axis parallel to the substrate 102 and a second portion 104y of the plurality of magnetic sensors 104 can be arranged to detect local magnetic fields along a y-axis parallel to the substrate 102 perpendicular to the x-axis. Additionally or alternatively, the first and second portions 104x, 104y of the plurality of magnetic sensors 104 can be arranged in an alternating array on the substrate 102.

In another embodiment, the plurality of magnetic sensors 104 can include z-axis sensors aligned to directly detect a z-axis local magnetic field (aligned normal to the substrate 102). In some embodiments, it may be useful for all of the plurality of sensors to be z-axis magnetic sensors. In other embodiments, the inventors contemplate a mixture of x-axis, y-axis, and z-axis sensors to be disposed on the substrate 102. The arrays of x-axis, y-axis, and z-axis magnetic sensors can be disposed in a pattern. In some embodiments, z-axis magnetic field data can provide enhanced spatial resolution compared to x-axis and y-axis magnetic field data. The sensors can be arranged in a XZYZ pattern (to be read clockwise, akin to a Bayer filter).

The sensor interface circuit 108 can include conductive traces 110 disposed on the substrate 102. A plurality of mounting pads 112 can be disposed on the substrate 102 and operatively coupled to the conductive traces 110 and respective ones of the plurality of magnetic sensors 104. A plurality of bonding pads 114 can be operatively coupled to the conductive traces 110 and disposed on the substrate 102. A wire bond 116 can respectively couple each bonding pad 114 to a corresponding magnetic sensor 104. The conductive traces 110 can include metal traces.

Figure 2:
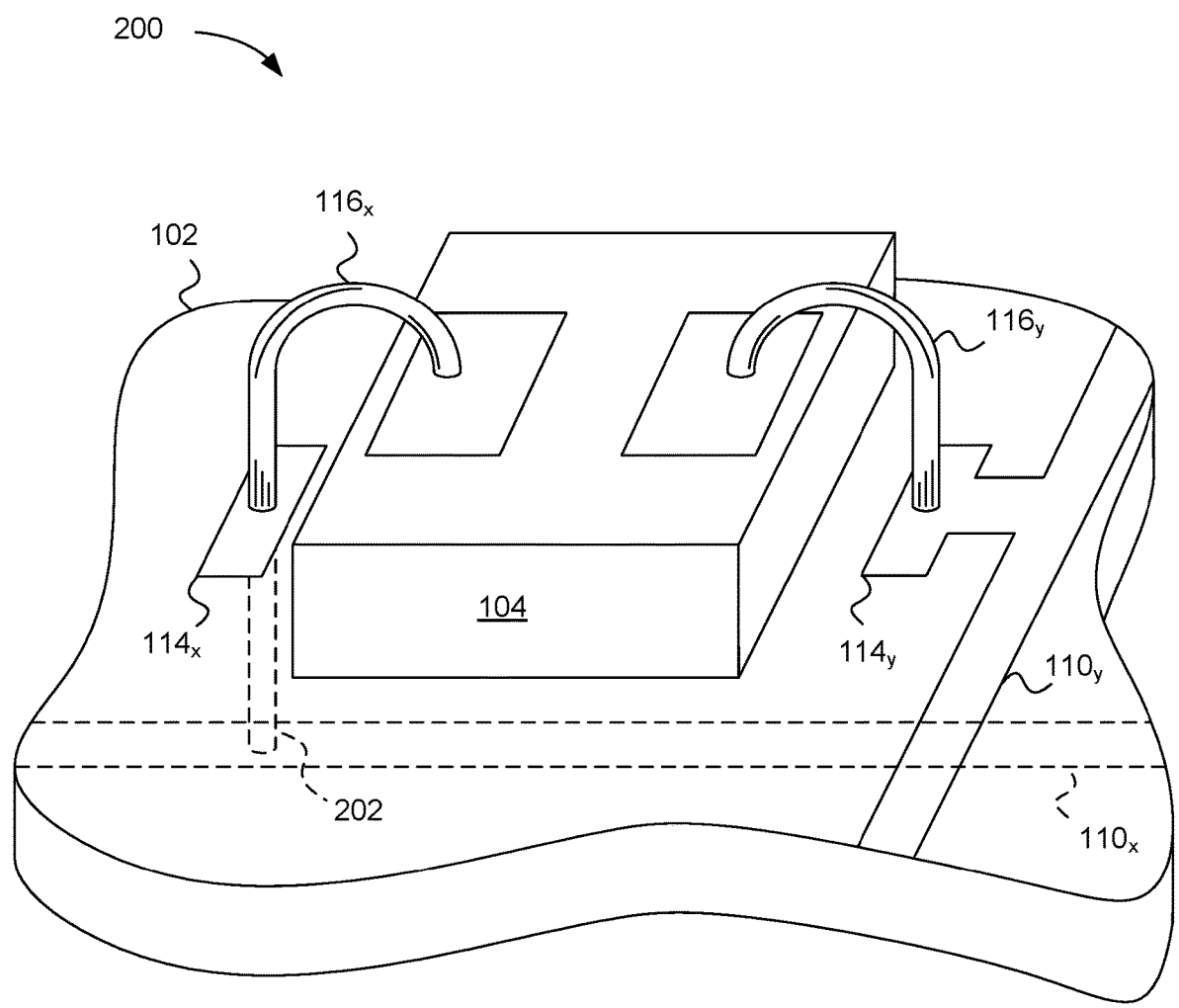
FIG. 2 is a partial view of a magnetic sensor array, according to an embodiment.

FIG. 2 is a partial view of a magnetic sensor array 200, according to an embodiment. The sensor interface circuit can include respective row and column conductive traces 110x, 110y disposed on the substrate 102. Respective bonding pads 114x, 114y can be disposed on the substrate and operatively coupled to the conductive traces 110x, 110y, optionally through vias 202. Wire bonds 116x, 116y can couple the bonding pads 114x, 114y to each magnetic sensor 104.

Figure 3:
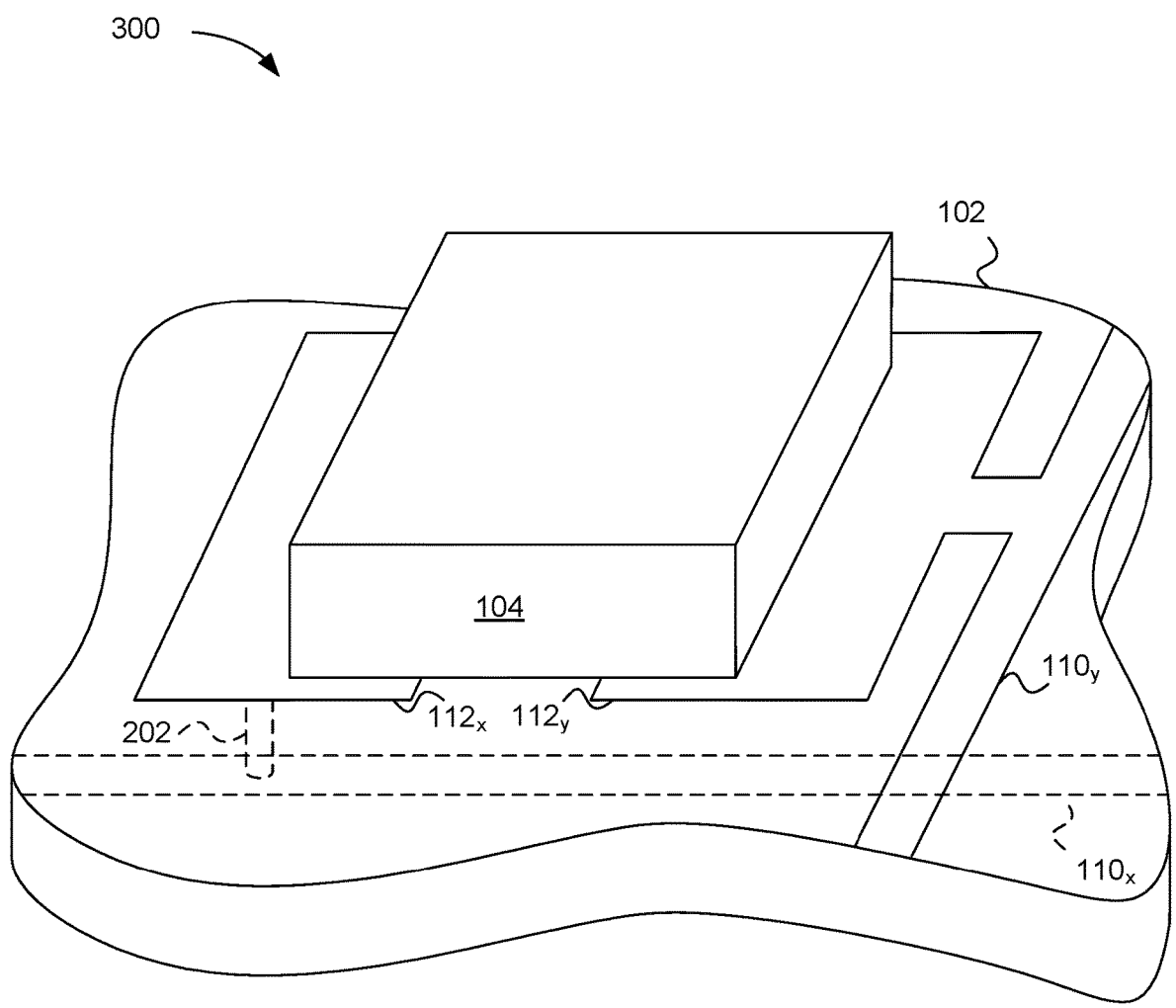
FIG. 3 is a partial view of a magnetic sensor array, according to an embodiment.

FIG. 3 is a partial view of a magnetic sensor array 300, according to another embodiment. The sensor interface circuit can include conductive traces 110x, 110y disposed on the substrate 102. A plurality of pairs of mounting pads 112x, 112y can be disposed on the substrate 102 and operatively coupled to the conductive traces 110x, 110y. Each of the magnetic sensors 104 can be coupled to a respective pair of mounting pads 112x, 112y.

In an alternative embodiment, areal density of the magnetic sensors 104 can be increased by the use of buried traces 110x, 110y. The buried traces can be coupled to the mounting pads 112x, 112y through vias 202 formed between selected conductive traces and the mounting pads.

Figure 4:
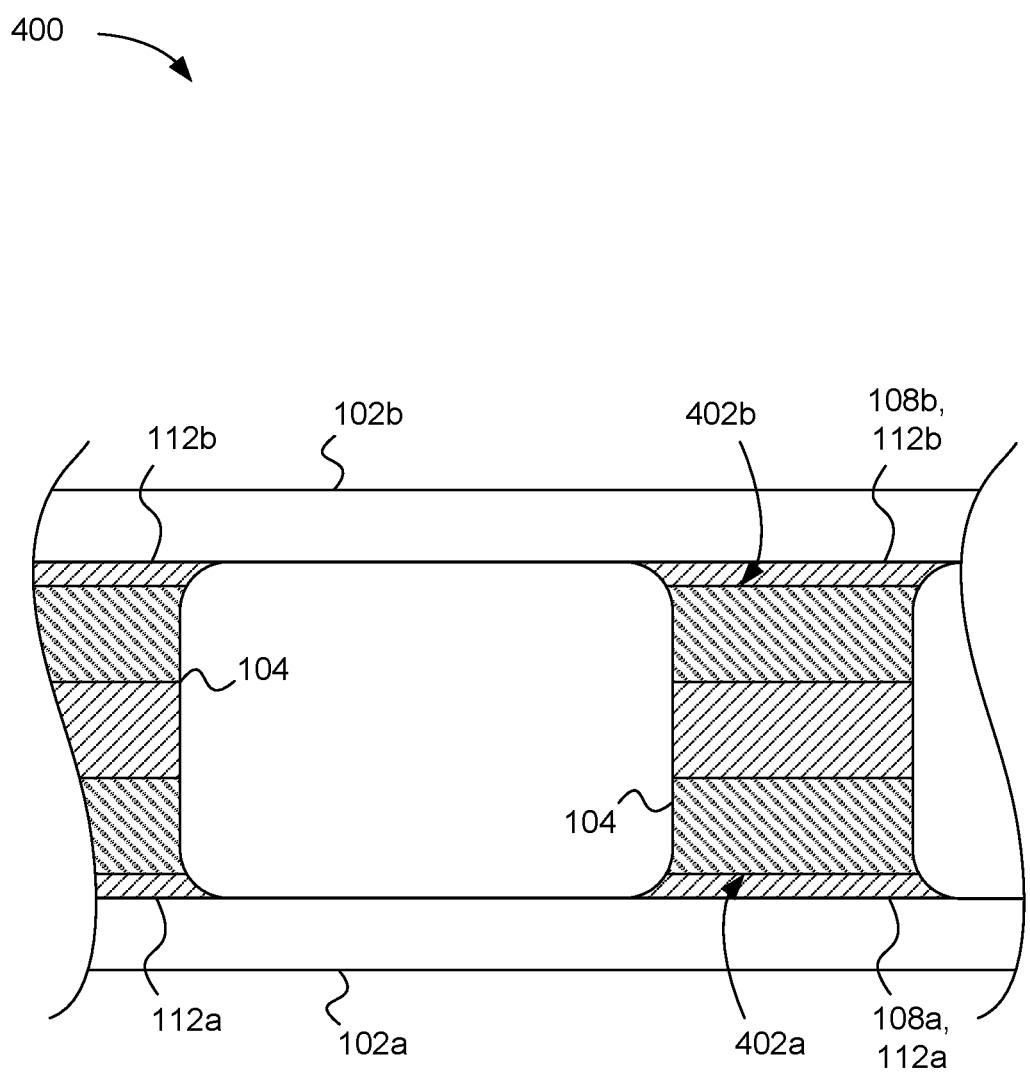
FIG. 4 is a sectional view of a magnetic sensor array, according to an embodiment.

FIG. 4 is a sectional view of a magnetic sensor array 400, according to another embodiment. The substrate can include two substrates 102a, 102b. The sensor interface circuit can include two sensor interface circuits 108a, 108b respectively disposed on each of the two substrates 102a, 102b. Each of the two sensor interface circuits 108a, 108b can include conductive traces disposed on each respective substrate 102a, 102b. A plurality of mounting pads 112a, 112b can be disposed on the respective substrate 102a, 102b and operatively coupled to the conductive traces. Each sensor 104 can include a bottom surface 402a operatively coupled to a respective one of the plurality of mounting pads 112a disposed on the first substrate 102a. Each sensor 104 can include a top surface 402b opposite of the bottom surface 402a and in contact with a respective one of the plurality of mounting pads 112b disposed on the second substrate 102b.

Figure 5:
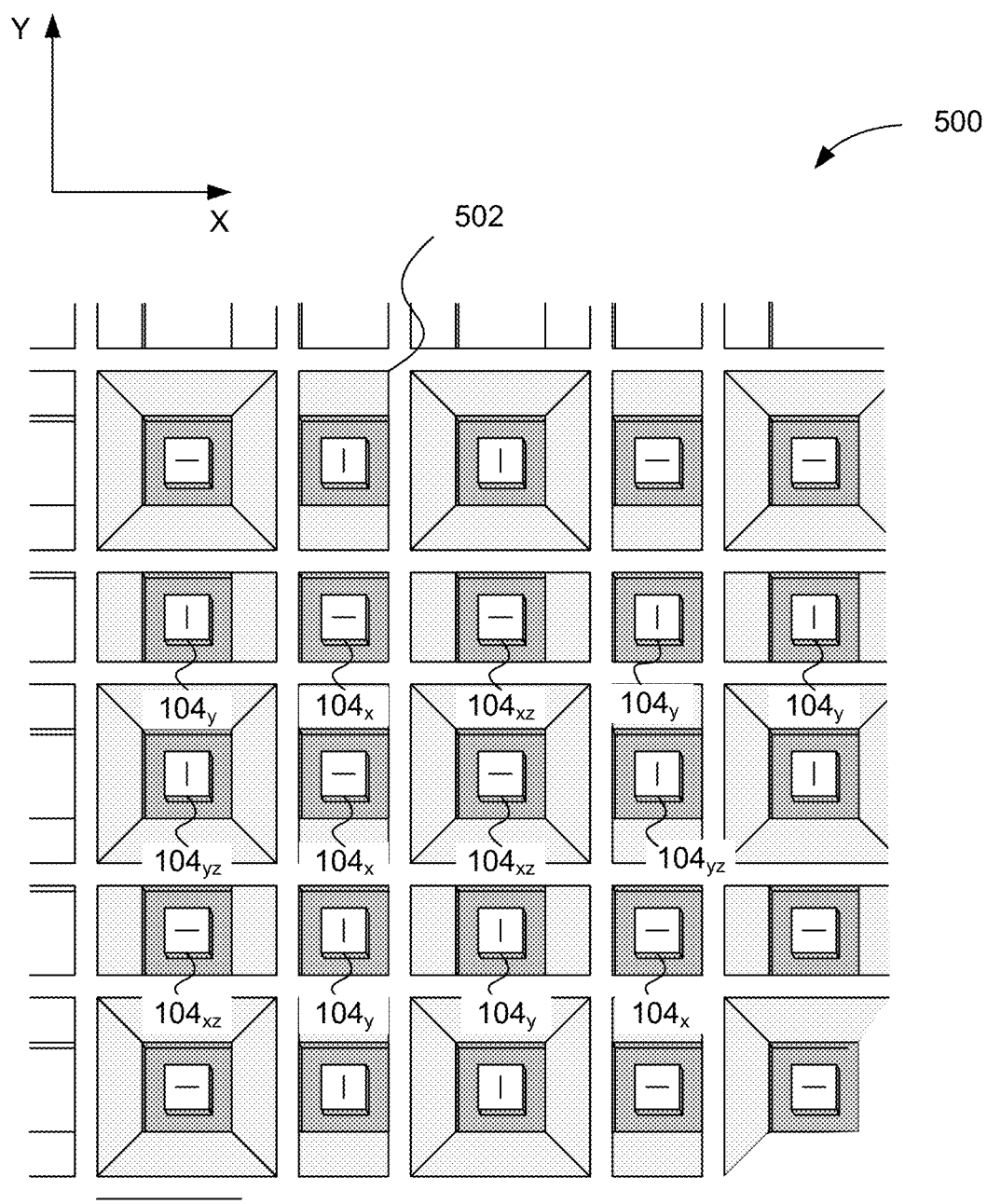
FIG. 5 is a partial top view of a magnetic sensor array, according to an embodiment.
Figure 6:
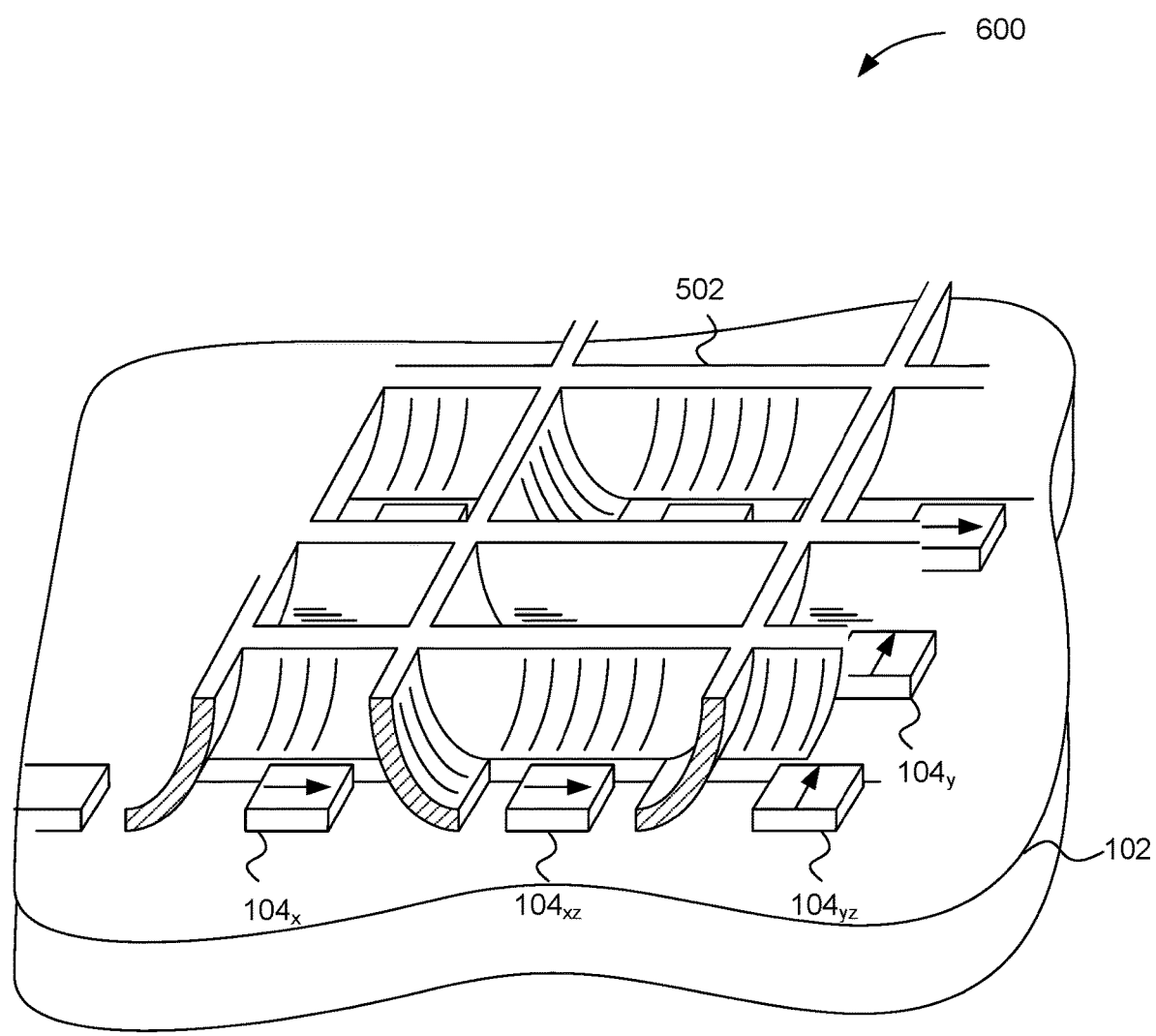
FIG. 6 is a perspective view of a portion of the magnetic sensor array of FIG. 5, according to an embodiment.
Figure 7:
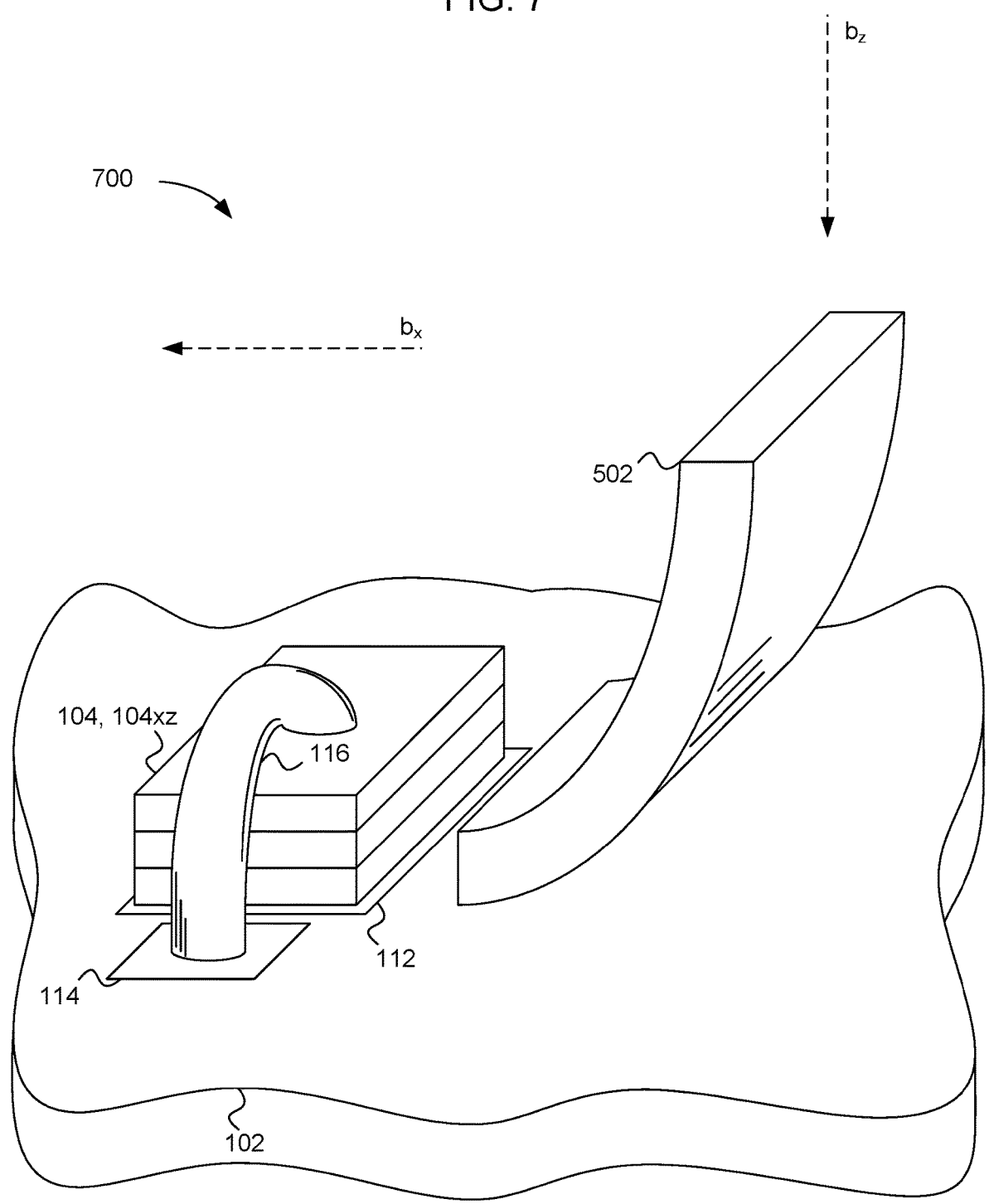
FIG. 7 is a detail view of an illustrative sensor in the magnetic sensor array of FIG. 5 and a portion of a magnetic field converter configured to guide a magnetic field component received normal to a substrate surface to an axis parallel to the substrate surface, according to an embodiment.

FIG. 5 is a partial top view of a magnetic sensor array 500, according to an embodiment. FIG. 6 is a perspective view 600 of a portion of the magnetic sensor array 500 of FIG. 5, according to an embodiment. FIG. 7 is a detail view 700 of the magnetic sensor array 500 of FIG. 5, according to an embodiment.

Referring to FIGS. 5-7, a first portion 104x of the plurality of magnetic sensors 104 can be arranged to detect local magnetic fields along an x-axis parallel to the substrate 102. A second portion 104y of the plurality of magnetic sensors 104 can be arranged to detect local magnetic fields along a y-axis parallel to the substrate 102 perpendicular to the x-axis. A third portion 104xz of the plurality of magnetic sensors 104 can be arranged to detect a combination of local magnetic fields along the x-axis parallel to the substrate 102 and local magnetic fields along a z-axis perpendicular to the substrate 102. A fourth portion 104yz of the plurality of magnetic sensors 104 can be arranged to detect a combination of local magnetic fields along the y-axis parallel to the substrate 102 perpendicular to the x-axis and local magnetic fields along a z-axis perpendicular to the substrate 102.

Referring to FIGS. 5-7, the magnetic sensor array 500, 600, 700 can further include a magnetic field converter 502 disposed proximate to the plurality of sensors 104. The magnetic field converter 502 can include a low coercivity metal configured to convert at least a portion of a z-axis magnetic field component to a converted magnetic field component in an x,y plane.

The magnetic field converter 502 can be formed from mu-metal, a stamped and punched metal sheet, a stamped metal screen, and/or formed by plating a surface of a dielectric substrate. The magnetic field converter 502 can include a curved shape selected to convey the z-axis magnetic field component into the x,y plane.

The converted magnetic field component in the x,y plane can include at least of a portion of a magnetic field component aligned through at least a portion of the magnetic sensors. The portion of the magnetic sensors aligned to the magnetic field component in the x,y plane can include at least one magnetic sensor 104.

The portion of the magnetic field sensors 104 aligned to the magnetic field component in the x,y plane can include a portion of the magnetic field sensors 104 corresponding to a magnetic field return loop distance. The magnetic field return loop distance can correspond to a displacement between magnetic poles of a sensed magnetic object. The magnetic field return loop distance can correspond to a completed magnetic circuit between opposite magnetic poles comprising a magnetically sensed object.

Figure 8:
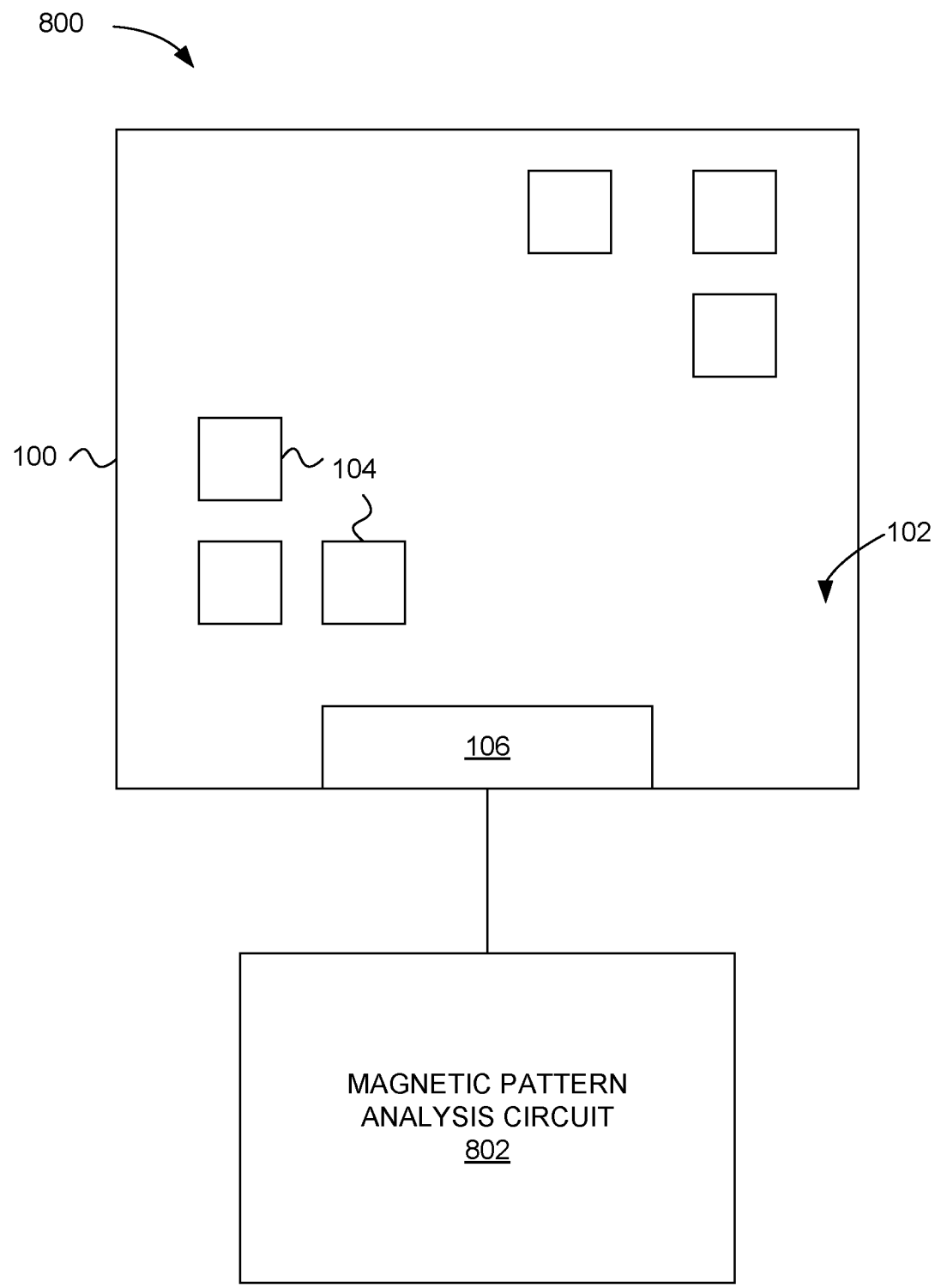
FIG. 8 is a block diagram of a magnetic sensing system, according to an embodiment.

FIG. 8 is a block diagram of a magnetic sensor system 800, according to an embodiment. A magnetic sensor array 100 can operatively couple to a magnetic pattern analysis circuit 802 via the sensor interface circuit 108 and the sensor array interface 106. The magnetic pattern analysis circuit 802 can be configured to correlate a distance between sensors 104 in the array to a physical distance between poles of a sensed magnetic object.

Various sensor array sizes are contemplated and/or have been tested by the inventors. According to embodiments, the plurality of magnetic sensors 104 are disposed in an array of at least two sensors by two sensors. For example, the plurality of magnetic sensors 104 can include an array of at least eight sensors by eight sensors. In another embodiment, more or fewer magnetic sensors 104 can be combined on a substrate.

Various types of magnetic field sensors are contemplated and/or have been tested by the inventors. In an embodiment, the plurality of magnetic sensors 104 can include a plurality of bare-dies. In another embodiment, the plurality of magnetic sensors 104 can include a plurality of sensors formed directly on the substrate 102. Various magnetic sensing technologies can be used by the magnetic sensors 104. For example, the magnetic sensors 104 can include spintronic sensors, inductive sensors, and/or coil-type sensors. Generally, sensors 104 described herein are magnetometers.

For purposes of example, a spintronic sensor can include a first high coercivity layer magnetically poled along a first axis, a low coercivity layer disposed on the first high coercivity layer and a second high coercivity layer magnetically poled along the first axis and disposed on the low coercivity layer opposite the first high coercivity layer. The low coercivity layer is arranged to be magnetically poled by a detectable magnetic field having a second axis different than the first axis. The magnetic sensor can be configured to exhibit a variable resistance through the low coercivity layer as a function of an angle between the first and second axes.

The substrate 102 can be a flexible substrate. A flexible substrate can be useful, for example, for conforming the magnetic sensors 104 to a curved surface. The flexible substrate can include polyimide. Additionally or alternatively, the substrate 102 can include a non-flexible substrate. The non-flexible substrate can include a fiberglass-epoxy substrate. For example, a fiberglass-epoxy substrate can be a planar substrate or can be molded to a shape conforming to an object selected for sensing. In another embodiment, the substrate can include a curved substrate.

In some embodiments, it is desirable to detect magnetic fields produced within or adjacent to a curved surface. The substrate 102 can optionally be curved to match the curvature of the measured surface. For example, a prototype measured surface can be used as a master. A mold release compound can be applied to the prototype measured surface. Fiberglass and epoxy can be laid up over the release-treated prototype surface.

After curing, the curved substrate 102 is removed from the prototype surface and trimmed. A sensor interface circuit 108 (as shown in FIG. 1) can be formed by running copper (or other conductor) wires across the back of the curved substrate 102 (the back side being the side opposite to the measured surface). Individual sensors 104 are adhered to the back of the curved substrate 102, for example using silicone adhesive. The wires making up the sensor interface circuit 108 are individually soldered to the magnetic sensors 104. Wires can also be tacked or fully adhered to the back of the curved substrate 102 using silicone adhesive. A sensor array interface 106 can be formed from an electrical junction block that is coupled to each of the wires.

Figure 9:
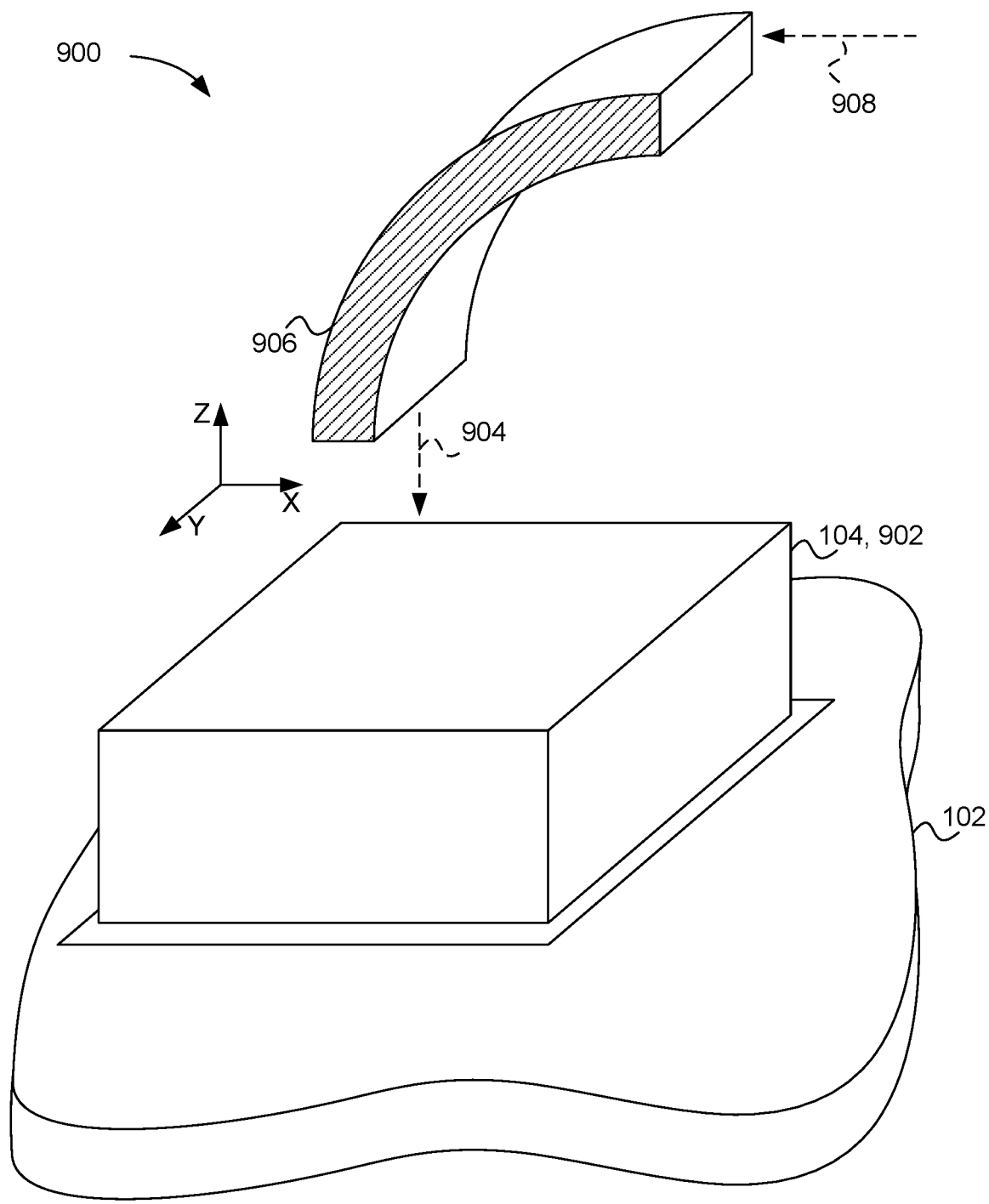
FIG. 9 is a detail view of an illustrative sensor in a magnetic sensor array and a portion of a magnetic field converter configured to guide a magnetic field component received parallel to a substrate surface to an axis normal to the substrate surface, according to an embodiment.

FIG. 9 is a partial view of the magnetic sensor array 900, according to an embodiment. The magnetic sensor array 900 can include at least a portion 902 of the plurality of magnetic sensors 104 arranged to detect local magnetic fields 904 along a z-axis normal to the substrate 102. Additionally or alternatively, other portions 902 of the plurality of magnetic sensors 104 can be arranged to respectively detect local magnetic fields along an x-axis parallel to the substrate 102 and along a y-axis parallel to the substrate 102 and perpendicular to the x-axis. According to an embodiment, substantially all of the magnetic sensors 104 can be arranged to detect local magnetic fields 904 along a z-axis normal to the substrate 102.

The magnetic sensor array 900 can further include a magnetic field converter 906 disposed proximate to at least some of the portion 902 of the plurality of sensors 104. The magnetic field converter 906 can include a low coercivity metal configured to convert at least a portion of an x-axis magnetic field component 908 to a converted magnetic field component 904 along the z-axis. The magnetic field converter 906 can be configured to convert the x-axis magnetic field component to a local z-axis magnetic field component 904 for detection by a portion 902 of the magnetic sensors 104 arranged to detect local magnetic fields 904 along the z-axis. Additionally or alternatively, the magnetic field converter 906 can include a low coercivity metal configured to convert at least a portion of a y-axis magnetic field component to a converted magnetic field component 904 along the z-axis.

Figure 10:
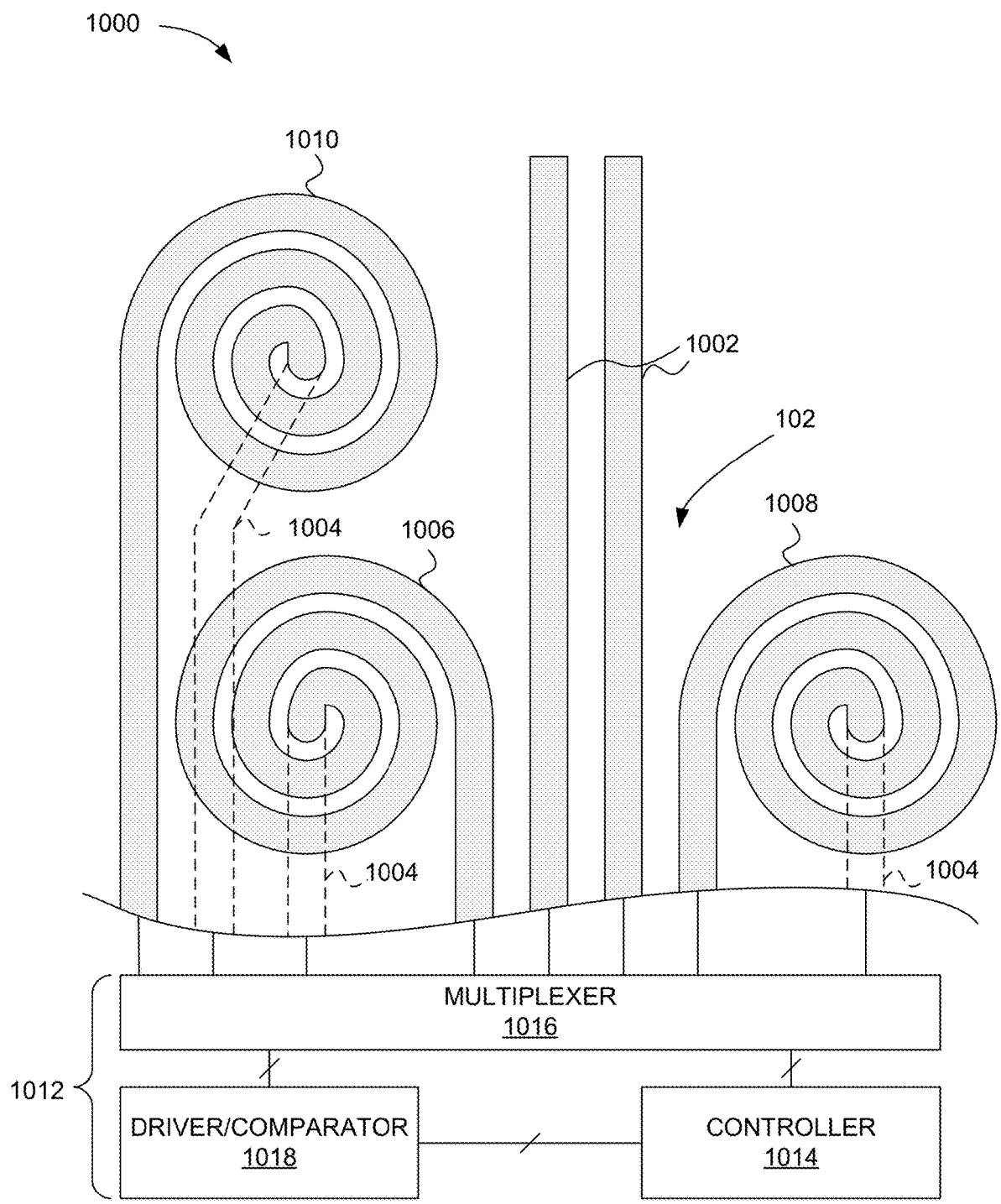
FIG. 10 is a plan (top) view of a magnetic sensor system including a plurality of z-axis magnetic field sensors formed directly on a substrate, according to an embodiment

FIG. 10 is a plan (top) view of a magnetic sensor system 1000 including a plurality of z-axis magnetic field sensors formed directly on a substrate, according to an embodiment. The magnetic pattern sensor system 1000 can include a sensor substrate 102. A plurality of conductive traces 1002, 1004 can be formed directly on the sensor substrate 102. A plurality of magnetic field sensors 1006, 1008, 1010 can be formed from the plurality of conductive traces 1002, 1004. A control circuit 1012 can be operatively coupled to the plurality of conductive traces 1002, 1004.

The plurality of magnetic field sensors 1006, 1008, and 1010 can be coils configured to generate current flow responsive to a local magnetic field component and to modify a current flow applied to each magnetic field sensor as a function of a local magnetic field component. The plurality of magnetic field sensors 1006, 1008, and 1010 each can be configured to detect a magnetic field component oriented normal to the sensor substrate 102.

In an embodiment, the sensor substrate 102 can be planar. The magnetic field sensors 1006, 1008, 1010 can be formed by screen printing a thick film conductive paste on the sensor substrate 102. The magnetic field sensors 1006, 1008, 1010 can be formed by pad printing a thick film conductive paste on the sensor substrate 102. The magnetic field sensors 1006, 1008, 1010 can be formed from a printed and cured conductive thick film paste. Additionally or alternatively, the magnetic field sensors 1006, 1008, 1010 can be formed by selectively etching a conductive layer carried by the sensor substrate 102. The sensor substrate 102 can be rigid. In another embodiment, the sensor substrate 102 can be flexible.

The control circuit 1012 can include a multiplexer 1016 configured to select and enable a subset of the magnetic field sensors 1006, 1008, 1010 for detecting local magnetic field components. An electronic controller 1014 can be configured to operate magnetic sensor 1006, 1008, 1010 detection logic. A driver and comparator circuit 1018 can be configured to detect an electrical signal corresponding to a magnetic field component corresponding to each magnetic sensor 1006, 1008, 1010. The control circuit 1012 can be configured to apply a drive voltage to each magnetic field sensor 1006, 1008, 1010.

The control circuit 1012 can be configured to detect an electrical response of each magnetic field sensor 1006, 1008, 1010 to the drive voltage. The control circuit 1012 can be configured to correlate the electrical response of each magnetic field sensor 1006, 1008, 1010 to a local magnetic field strength proximate to the respective magnetic field sensor.

The electrical response can include a current flow that is a function of the local magnetic field strength. The electrical response can include a time between application of the drive voltage and receipt of a current flow respectively to and from each magnetic field sensor 1006, 1008, 1010. Additionally and/or alternatively, the electrical response can include a comparison of voltage between adjacent magnetic field sensors 1006, 1008, 1010 that are coiled in opposite directions.

In an embodiment, the drive voltage can be bipolar. The electrical response can include a response time for rising and falling edges of a drive waveform that is a function of a local magnetic field component.

According to an embodiment, the control circuit 1012 can be configured to detect a voltage difference generated by pairs of magnetic field sensors 1006 and 1008, and 1006 and 1010 that are coiled in opposite directions.

In another embodiment, the magnetic field sensors 1006, 1008, 1010 can be coiled in the same direction (e.g., all right-hand or all left-hand). One or more sensors can be driven by the driver-comparator circuit 1018 to output a known magnetic field component. One or more different sensors can receive an induced current flow responsive to the known magnetic field component plus an unknown component. The one or more driven sensors can then be stopped being driven to output the known magnetic field component. The one or more different sensors can receive an induced current flow attributable to only the unknown component. Timing of differences in current flow in the non-driven sensor can be used to determine a value for the unknown magnetic field component.

Additional or alternative sensing modalities can similarly be used by the control circuit 1012 to determine unknown magnetic field components across the array of magnetic field sensors 1006, 1008, 1010.

Figure 11:
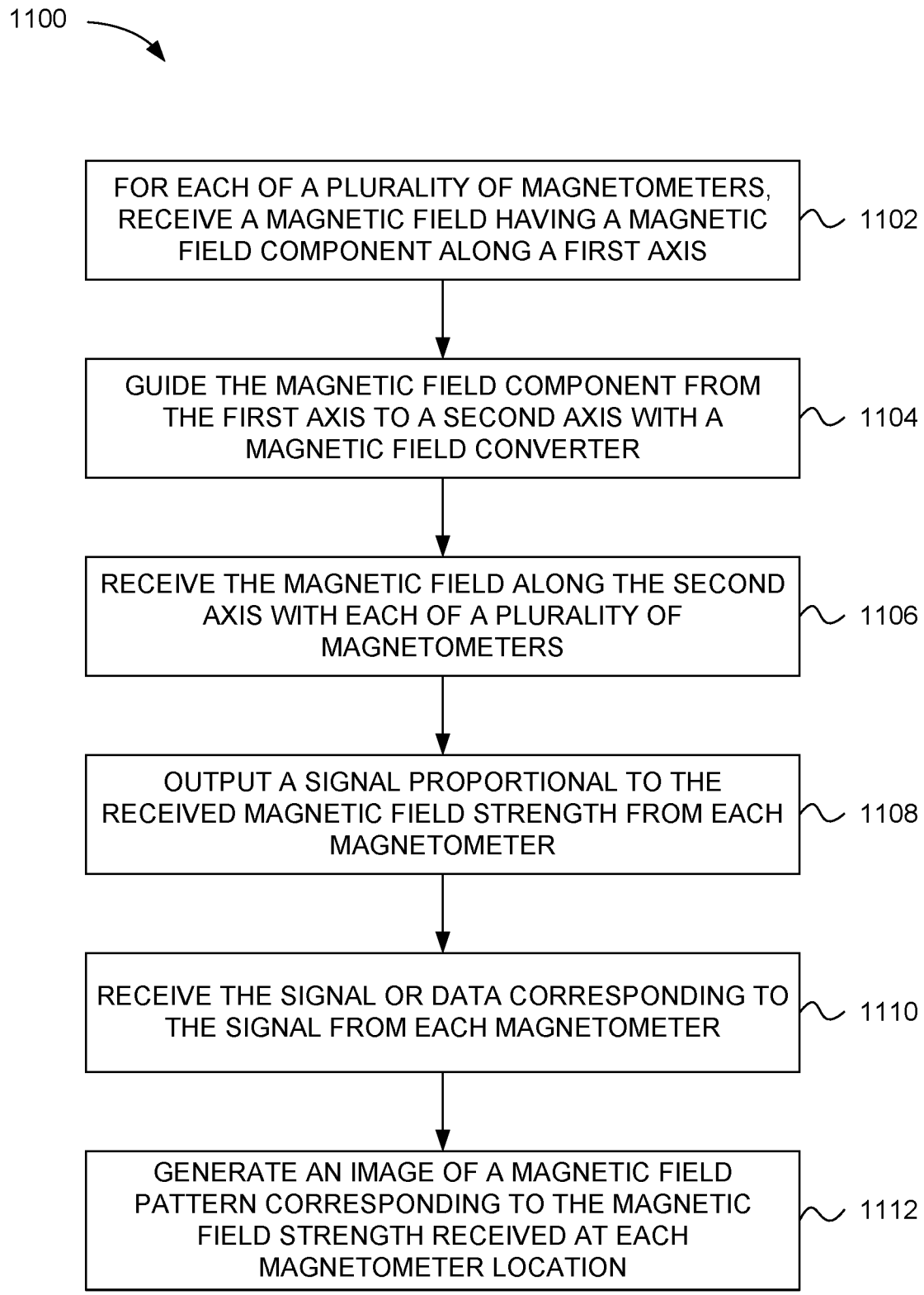
FIG. 11 is a flow chart showing a method for operating a magnetic sensor array, according to an embodiment.

FIG. 11 is a flow chart showing a method 1100 for operating a magnetic sensor array, according to an embodiment. The method 1100 includes step 1102 wherein, for each of a plurality of magnetometers in a magnetic sensor array, receiving a magnetic field having a magnetic field component along a first axis. In step 1104, the magnetic field component is guided with a magnetic field converter from the first axis to a second axis. Proceeding to step 1106, the magnetic field is received along the second axis with the magnetometer.

As shown in step 1108, a signal or data proportional to the received magnetic field strength along the second axis is output from the magnetometer through a sensor interface circuit to a sensor array interface. The method can further include step 1110, wherein the plurality of data or signals corresponding to the plurality of magnetometers is received from the sensor array interface into a magnetic pattern analysis circuit. As shown in step 1112, an image of a magnetic field pattern corresponding to the received magnetic field at each of a plurality of magnetometer locations in the magnetic sensor array is generated by the magnetic pattern analysis circuit.

Referring to step 1104, guiding the magnetic field component with the magnetic field converter from the first axis to the second axis can include guiding the magnetic field component with a magnetic field converter comprising a low coercivity metal, for example, mu-metal.

In some embodiments, the first and second axes are transverse to one another. This can be used to couple three-axis magnetic field strength patterns into a magnetometer array formed to sense in only one or two axes. This can cause the magnetometers to detect three axis magnetic fields and allow the magnetic pattern analysis circuit to generate three axis magnetic field images.

In other embodiments, the first and second axes are parallel to one another. This can be used to concentrate magnetic field strength across each magnetometer.

Figure 12:
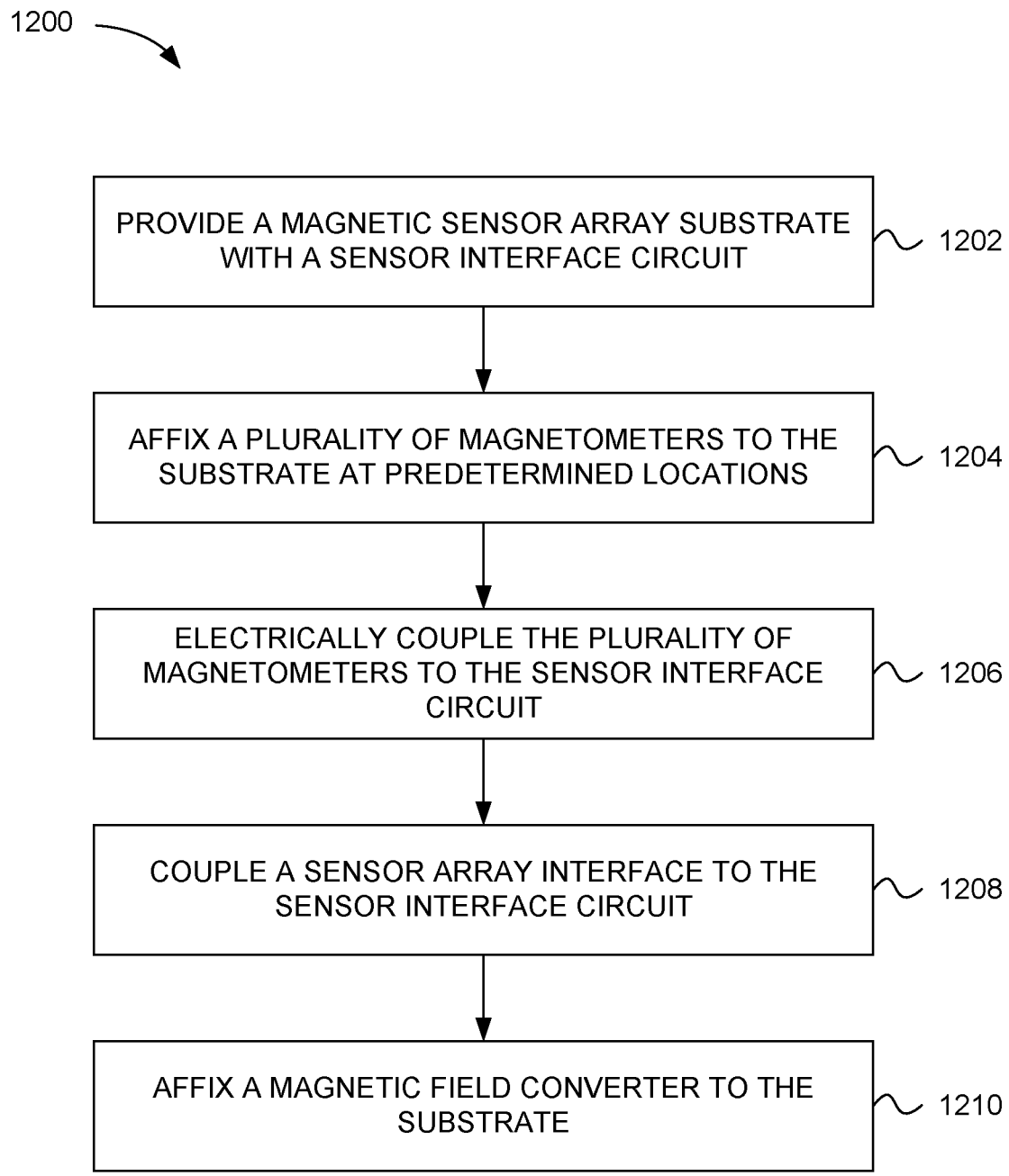
FIG. 12 is a flow chart showing a method for making a magnetic sensor array, according to an embodiment.

FIG. 12 is a flow chart showing a method 1200 for making a magnetic sensor array, according to an embodiment. Beginning with step 1202, a substrate including a sensor interface circuit is provided. In step 1204, a plurality of magnetometers are affixed to the substrate at respective predetermined locations. The plurality of magnetometers can be unpackaged magnetometers. Proceeding to step 1206, each of the magnetometers is electrically coupled to the sensor interface circuit. In an embodiment, electrically coupling each of the magnetometers to the sensor interface circuit is performed by wire bonding. In another embodiment, the magnetometers are electrically coupled to the sensor interface circuit by surface mount reflow.

In an embodiment, affixing the plurality of magnetometers to the substrate in step 1204 and electrically coupling each of the magnetometers to the sensor interface circuit in step 1206 is performed simultaneously by bonding each magnetometer to at least one bonding pad that is in electrical continuity with a portion of the sensor interface circuit.

Proceeding to step 1208, a sensor array interface is coupled to the sensor interface circuit.

Optionally, the method 1200 can include step 1210, wherein a magnetic field converter is affixed to the substrate. The magnetic field converter can include a stamped and punched low coercivity metal sheet, such as may be seen in FIGS. 5-7, for example.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:

1. A magnetic sensor array, comprising:
   a substrate;
   a plurality of magnetic sensors disposed on the substrate;
   a sensor array interface disposed on the substrate;
   a sensor interface circuit disposed on the substrate and configured to operatively couple the plurality of magnetic sensors to the sensor array interface; and
   a magnetic field converter disposed proximate to the plurality of magnetic sensors, the magnetic field converter including a low coercivity metal configured to convert at least a portion of a first magnetic field component to a converted magnetic field component in a plane perpendicular to the first magnetic field component.

2. The magnetic sensor array of claim 1, wherein a first portion of the plurality of magnetic sensors are arranged to detect local magnetic fields along an x-axis parallel to the substrate; and
   wherein a second portion of the plurality of magnetic sensors are arranged to detect local magnetic fields along a y-axis parallel to the substrate and perpendicular to the x-axis.

3. The magnetic sensor array of claim 2, wherein the first and second portions of the plurality of magnetic sensors are arranged in an alternating array on the substrate.

4. The magnetic sensor array of claim 1, wherein the substrate includes two substrates;
   wherein the sensor interface circuit comprises two sensor interface circuits respectively disposed on each of the two substrates;
   each of the two sensor interface circuits further comprising:
   conductive traces disposed on each respective substrate; and
   a plurality of mounting pads disposed the respective substrate and operatively coupled to the conductive traces;
   wherein each sensor includes a bottom surface operatively coupled to a respective one of the plurality of mounting pads disposed on the first substrate; and
   wherein each sensor includes a top surface opposite of the bottom surface and in contact with a respective one of the plurality of mounting pads disposed on the second substrate.

5. The magnetic sensor array of claim 1, wherein a first portion of the plurality of magnetic sensors is arranged to detect local magnetic fields along an x-axis parallel to the substrate;
   wherein a second portion of the plurality of magnetic sensors is arranged to detect local magnetic fields along a y-axis parallel to the substrate perpendicular to the x-axis;
   wherein a third portion of the plurality of magnetic sensors is arranged to detect a combination of local magnetic fields along the x-axis parallel to the substrate and local magnetic fields along a z-axis perpendicular to the substrate; and
   wherein a fourth portion of the plurality of magnetic sensors is arranged to detect a combination of local magnetic fields along the y-axis parallel to the substrate perpendicular to the x-axis and local magnetic fields along a z-axis perpendicular to the substrate.

6. The magnetic sensor array of claim 1, wherein the magnetic field converter is disposed proximate to the plurality of sensors,
   the first magnetic field component is a portion of a z-axis magnetic field component, and
   the plane perpendicular to the first magnetic field component is an x, y plane.

7. The magnetic sensor array of claim 6, wherein the magnetic field converter is formed from mu-metal.

8. The magnetic sensor array of claim 6, wherein the magnetic field converter is formed from a stamped and punched metal sheet.

9. The magnetic sensor array of claim 6, wherein the magnetic field converter is formed from a stamped metal screen.

10. The magnetic sensor array of claim 6, wherein the magnetic field converter is formed by plating a surface of a dielectric substrate.

11. The magnetic sensor array of claim 6, wherein the magnetic field converter includes a curved shape selected to convey the z-axis magnetic field component into the x,y plane.

12. The magnetic sensor array of claim 6, wherein the converted magnetic field component in the x,y plane includes at least a portion of a magnetic field component aligned through at least a portion of the magnetic sensors.

13. The magnetic sensor array of claim 1, further comprising:
    a magnetic pattern analysis circuit operatively coupled to the sensor array interface and configured to correlate a distance between sensors in the array to a physical distance between poles of a sensed magnetic object.

14. The magnetic sensor array of claim 1, wherein the plurality of magnetic sensors comprises an array of at least two sensors by two sensors.

15. The magnetic sensor array of claim 14, wherein the plurality of magnetic sensors comprises an array of at least ten sensors by ten sensors.

16. The magnetic sensor array of claim 1, wherein the plurality of magnetic sensors each comprise:
    a first high coercivity layer magnetically poled along a first axis;
    a low coercivity layer disposed on the first high coercivity layer; and
    a second high coercivity layer magnetically poled along the first axis and disposed on the low coercivity layer opposite the first high coercivity layer.

17. The magnetic sensor array of claim 16, wherein the low coercivity layer is configured to be magnetically poled by a detectable magnetic field having a second axis different than the first axis; and
    wherein the magnetic sensor is configured to exhibit a variable resistance through the low coercivity layer as a function of an angle between the first and second axes.

18. The magnetic sensor array of claim 1, wherein each of the plurality of magnetic sensors comprises an inductive sensor.

19. The magnetic sensor array of claim 1, wherein the substrate includes a planar substrate.

20. The magnetic sensor array of claim 1, wherein the substrate includes a curved substrate.

21. The magnetic sensor array of claim 1, wherein at least a portion of the plurality of magnetic sensors are arranged to detect local magnetic fields along a z-axis normal to the substrate.

22. The magnetic sensor array of claim 21, wherein other portions of the plurality of magnetic sensors are arranged to respectively detect local magnetic fields along an x-axis parallel to the substrate and along a y-axis parallel to the substrate and perpendicular to the x-axis.

23. The magnetic sensor array of claim 21, wherein substantially all of the magnetic sensors are arranged to detect local magnetic fields along a z-axis normal to the substrate.

24. The magnetic sensor array of claim 21, wherein
the magnetic field converter is disposed proximate to at least some of the portion of the plurality of sensors, the low coercivity metal of the magnetic field converter configured to convert at least a portion of an x-axis magnetic field component to a converted magnetic field component along the z-axis.

25. The magnetic sensor array of claim 24, wherein the magnetic field converter is configured to convert the x-axis magnetic field component to a local z-axis magnetic field for detection by a portion of the magnetic sensors arranged to detect local magnetic fields along the z-axis.

26. The magnetic sensor array of claim 21, wherein
the magnetic field converter is disposed proximate to at least some of the portion of the plurality of sensors, the low coercivity metal of the magnetic field converter configured to convert at least a portion of a y-axis magnetic field component to a converted magnetic field component along the z-axis.

27. The magnetic sensor array of claim 1, wherein the plurality of magnetic sensors comprise coils configured to generate current flow responsive to a local magnetic field component.

28. A method for making a magnetic sensor array, comprising:
providing a substrate including a sensor interface circuit;
affixing a plurality of magnetometers at respective predetermined locations to the substrate;
electrically coupling each of the magnetometers to the sensor interface circuit;
coupling a sensor array interface to the sensor interface circuit; and
affixing a magnetic field converter to the substrate, the magnetic field converter including a low coercivity metal configured to convert at least a portion of a first magnetic field component to a converted magnetic field component in a plane perpendicular to the first magnetic field component.

29. The method for making a magnetic sensor array of claim 28, wherein affixing a plurality of magnetometers to the substrate includes affixing unpackaged magnetometers to the substrate.

30. The method for making a magnetic sensor array of claim 28, wherein the magnetic field converter comprises a stamped and punched low coercivity metal sheet.

* * * * *